United States Patent
Adusumilli et al.

(10) Patent No.: US 10,340,355 B2
(45) Date of Patent: Jul. 2, 2019

(54) METHOD OF FORMING A DUAL METAL INTERCONNECT STRUCTURE

(71) Applicant: International Business Machines Corporation, Armonk, NY (US)

(72) Inventors: Praneet Adusumilli, Albany, NY (US); Hemanth Jagannathan, Niskayuna, NY (US); Koichi Motoyama, Clifton Park, NY (US); Oscar Van Der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 15/620,253

(22) Filed: Jun. 12, 2017

(65) Prior Publication Data
US 2017/0278939 A1   Sep. 28, 2017

Related U.S. Application Data

(62) Division of application No. 15/051,973, filed on Feb. 24, 2016, now Pat. No. 9,741,812.

(51) Int. Cl.
*H01L 29/45* (2006.01)
*H01L 29/08* (2006.01)
(Continued)

(52) U.S. Cl.
CPC .......... *H01L 29/45* (2013.01); *H01L 21/7685* (2013.01); *H01L 21/76802* (2013.01); *H01L 21/76858* (2013.01); *H01L 21/76882* (2013.01); *H01L 21/76897* (2013.01); *H01L 21/823418* (2013.01); *H01L 21/823431* (2013.01); *H01L 21/823475* (2013.01); *H01L 23/485* (2013.01); *H01L 23/53238* (2013.01); *H01L 23/53266* (2013.01); *H01L 27/0886* (2013.01);
(Continued)

(58) Field of Classification Search
CPC .............................................. H01L 21/823418
See application file for complete search history.

(56) References Cited

U.S. PATENT DOCUMENTS

| | | | |
|---|---|---|---|
| 5,956,609 | A | 9/1999 | Lee et al. |
| 5,990,021 | A | 11/1999 | Prall et al. |

(Continued)

FOREIGN PATENT DOCUMENTS

| | | |
|---|---|---|
| JP | H02267959 A | 11/1990 |
| JP | 2008-117853 A | 5/2005 |

OTHER PUBLICATIONS

List of IBM Patents or Patent Applications Treated as Related, dated Jun. 12, 2017, 2 pages.

*Primary Examiner* — Dung A. Le
(74) *Attorney, Agent, or Firm* — Scully, Scott, Murphy & Presser, P.C.; Daniel P. Morris, Esq.

(57) ABSTRACT

A method of forming source/drain contact structures that exhibit low contact resistance and improved electromigration properties is provided. After forming a first contact conductor portion composed of a metal having a high resistance to electromigration, such as, for example, tungsten, at a bottom portion of source/drain contact trench to form direct contact with a source/drain region of a field effect transistor, a second contact conductor portion composed of a highly conductive metal, such as, for example, copper or a copper alloy, is formed over the first contact conductor portion.

17 Claims, 6 Drawing Sheets

(51) Int. Cl.
*H01L 27/088* (2006.01)
*H01L 21/8234* (2006.01)
*H01L 21/768* (2006.01)
*H01L 23/485* (2006.01)
*H01L 29/417* (2006.01)
*H01L 23/532* (2006.01)
*H01L 23/522* (2006.01)
*H01L 29/78* (2006.01)
*H01L 29/66* (2006.01)

(52) U.S. Cl.
CPC .... *H01L 29/0847* (2013.01); *H01L 29/41791* (2013.01); *H01L 29/456* (2013.01); *H01L 21/76846* (2013.01); *H01L 21/76847* (2013.01); *H01L 21/823425* (2013.01); *H01L 23/5226* (2013.01); *H01L 29/665* (2013.01); *H01L 29/66628* (2013.01); *H01L 29/78* (2013.01)

(56) References Cited

U.S. PATENT DOCUMENTS

| | | | |
|---|---|---|---|
| 6,211,085 B1 | 4/2001 | Liu | |
| 6,258,707 B1 | 7/2001 | Uzoh | |
| 6,465,889 B1* | 10/2002 | Subramanian | H01L 21/76808 257/760 |
| 6,566,242 B1 | 5/2003 | Adams et al. | |
| 6,599,828 B1 | 7/2003 | Gardner | |
| 7,262,125 B2 | 8/2007 | Wongsenakhum et al. | |
| 7,629,264 B2 | 12/2009 | Bonilla et al. | |
| 7,737,026 B2 | 6/2010 | Li et al. | |
| 7,772,108 B2* | 8/2010 | Son | H01L 21/76831 257/E21.006 |
| 7,902,581 B2 | 3/2011 | Frohberg et al. | |
| 8,749,067 B2 | 6/2014 | Zhao et al. | |
| 8,836,129 B1* | 9/2014 | Hung | H01L 23/485 257/758 |
| 2007/0257323 A1* | 11/2007 | Tsui | H01L 23/485 257/382 |
| 2008/0099921 A1* | 5/2008 | Katata | H01L 21/76877 257/751 |
| 2008/0237869 A1 | 10/2008 | Li et al. | |
| 2008/0280432 A1 | 11/2008 | Chang et al. | |
| 2009/0169760 A1 | 7/2009 | Akolkar et al. | |
| 2012/0043592 A1* | 2/2012 | Zhao | H01L 21/76847 257/288 |
| 2013/0221528 A1 | 8/2013 | Cheng | |
| 2013/0320541 A1 | 12/2013 | Chang et al. | |

* cited by examiner

METHOD OF FORMING A DUAL METAL INTERCONNECT STRUCTURE

CROSS REFERENCE TO RELATED APPLICATIONS

This application is related to, and claims priority of, U.S. application Ser. No. 15/051,973, filed Feb. 24, 2016 (now U.S. Pat. No. 9,741,812), the entire contents of this application is incorporated herein by reference.

BACKGROUND

The present application relates to contact structures for semiconductor devices, and more particularly, to a source contact structure and a drain contact structure (collectively referred to hereinafter as source/drain contact structures) having low contact resistance and improved electromigration properties.

Field Effect Transistors (FETs) are essential components of all modern electronic products. Generally, after a transistor is formed, contact structures are made to connect a source region, a drain region, and/or a gate region of the transistor to make the transistor fully functional. Traditionally, the contact structures are typically formed of tungsten (W). However, as circuit densities are increased, the aspect ratio of contact structures has increased and adequate plating of such high aspect ratio contact structures with W has proven difficult. W-based contact structures suffer from gap fill issues. Oftentimes, seams or keyholes are formed within the contact structures. The presence of seams or keyholes negatively affects contact performance.

Copper (Cu) and Cu alloys are materials that are increasingly used in the fabrication of contact structures due to their low electrical resistance and excellent reflow properties at low temperatures which prevent seam/keyhole formation. Despite these advantages, Cu-based contact structures are more susceptible to electromigration. Cu readily diffuses into the active device regions (e.g., source/drain regions), thus causing leakage of FETs. Therefore, there remains a need to develop contact structures with low electrical resistance and improved electromigration properties.

SUMMARY

The present application provides source/drain contact structures that exhibit low contact resistance and improved electromigration properties. After forming a first contact conductor portion comprising a metal having a high resistance to electromigration such as W at a bottom portion of a source/drain contact trench to form direct contact with a source/drain region of a FET, a second contact conductor portion comprising a highly conductive metal such as Cu or a Cu alloy is formed over the first contact conductor portion. By separating the Cu-containing second contact conductor portion from the source/drain region with a non-Cu containing first contact conductor portion, the risk of electromigration caused by Cu diffusion is prevented. Also, the above described contact structure provides a reduced contact resistance since an essential portion of the source/drain contact structure is composed of highly conductive Cu.

In one aspect of the present application, a semiconductor structure is provided. The semiconductor structure includes source/drain regions present on opposite sides of at least one gate structure located over a channel region of a semiconductor fin, interlevel dielectric (ILD) portions overlying the at least one gate structure, and source/drain contact structures located within source/drain contact trenches that are laterally surrounded by the ILD portions. Each of the source/drain contact structures includes a first contact conductor portion located at a bottom portion of one of the source/drain contact trenches and contacting one of the source/drain regions, and a second contact conductor portion overlying the first contact conductor portion. The first contact conductor portion includes a first metal and the second contact conductor portion includes a second metal having a lower electromigration resistance and a lower electrical resistance than the first metal.

In another aspect of the present application, a method of forming a semiconductor structure is provided. In one embodiment, the method includes forming source/drain regions on opposite sides of at least one gate structure located over a channel region of a semiconductor fin. Source/drain contact trenches are then formed through an interlevel dielectric (ILD) layer overlying the source/drain regions and the at least one gate structure. Each of the source/drain contact trenches exposes at least a portion of one of the source/drain regions. Next, a conformal elemental metal liner is formed on sidewalls of each of the source/drain contact trenches followed by forming a conformal metal nitride liner over the elemental metal liner and a bottom surface of each of the source/drain contact trenches, and a first contact conductor over the metal nitride liner to fill a remaining volume of each of the source/drain contact trenches. The first contact conductor includes a first metal. After recessing the first contact conductor to provide a first contact conductor portion located at a bottom portion of each of the source/drain contact trenches, a conformal contact liner material layer is formed over a portion of the metal nitride liner that is not covered by the first contact conductor portion and the first contact conductor portion. A conformal adhesion layer is then formed over the contact liner material layer. Next, a second contact metal layer is formed over the adhesion layer. The second contact metal layer includes a second metal having a lower electromigration resistance and a lower electrical resistance than the first metal.

In another embodiment, the method includes forming source/drain regions on opposite sides of at least one gate structure located over a channel region of a semiconductor fin. Source/drain contact trenches are then formed through an interlevel dielectric (ILD) layer overlying the source/drain regions and the at least one gate structure. Each of the source/drain contact trenches exposes at least a portion of one of the source/drain regions. Next, a conformal elemental metal liner is formed on sidewalls of each of the source/drain contact trenches followed by forming a conformal metal nitride liner over the elemental metal liner and a bottom surface of each of the source/drain contact trenches, and a first contact conductor over the metal nitride liner to fill a remaining volume of each of the source/drain contact trenches. The first contact conductor includes a first metal. Next, the first contact conductor, the metal nitride liner and the elemental metal liner are recessed to provide a first contact conductor portion, a metal nitride liner portion and an elemental metal liner portion within each of the source/drain contact trenches. The recessing re-exposes sidewalls of an upper portion of each of the source/drain contact trenches. After forming a conformal contact liner material layer over top surfaces of the elemental metal liner portion, the metal nitride liner portion and the first contact conductor portion, and the exposed sidewalls of the upper portion of each of the source/drain contact trenches, a conformal adhesion layer is formed over the contact liner material layer. Next, a second contact metal layer is formed over the adhesion layer. The second contact metal layer comprises a second metal having a lower electromigration resistance and a lower electrical resistance than the first metal.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It should be noted that although the following description and drawings illustrate the basic processing steps employed to form source/drain contact structures with low contact resistance and improved electromigration properties in a gate-first processing flow for fin FETs (FinFETs), the basic concept of the present application can also be used in a gate-last processing flow known in the art. Furthermore, the basic concept of the present application can be applied to form source/drain contact structures in planar FETs and nanowire FETs as well.

Figure 1:
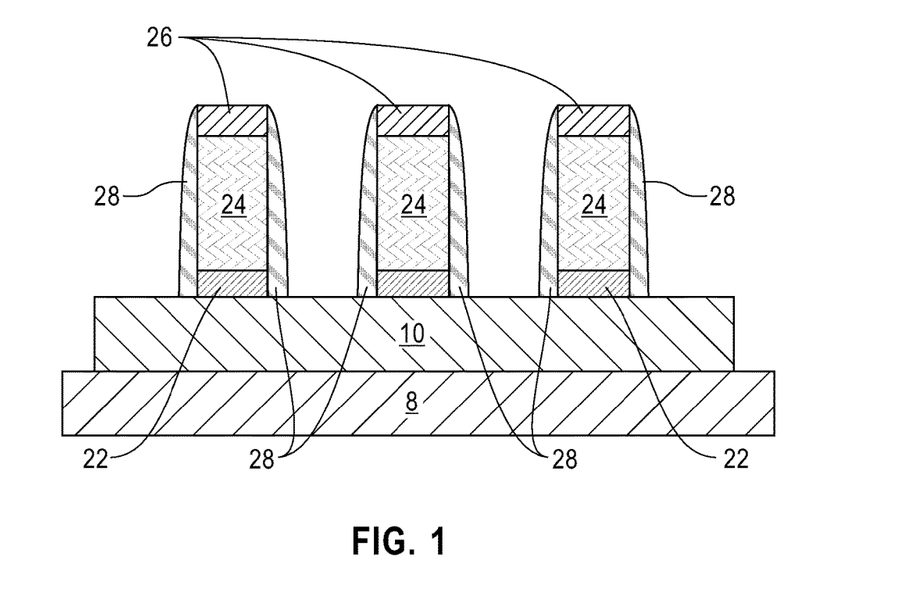
FIG. 1 is a cross-sectional view of a first exemplary semiconductor structure including gate structures formed over a semiconductor fin located on a substrate according to a first embodiment of the present application.

Referring to FIG. 1, a first exemplary semiconductor structure according to a first embodiment of the present application includes gate structures formed over a semiconductor fin 10 located on a substrate 8.

In one embodiment, the semiconductor fin 10 can be formed from a bulk substrate including a bulk semiconductor material throughout (not shown). In another embodiment and as shown in FIG. 1, the semiconductor fin 10 and the substrate 8 may be provided from a semiconductor-on-insulator (SOI) substrate, in which the top semiconductor layer of the SOI substrate provides the semiconductor fin 10 and the buried insulator layer provides the substrate 8. The SOI substrate typically includes, from bottom to top, a handle substrate (not shown), a buried insulator layer (i.e., substrate 8) and a top semiconductor layer (not shown).

The handle substrate may include a semiconductor material such as, for example, Si, Ge, SiGe, SiC, SiGeC, a III-V compound semiconductor, a II-VI compound semiconductor or any combinations thereof. The handle substrate provides mechanical support to the buried insulator layer and the top semiconductor layer. The thickness of the handle substrate can be from 30 µm to about 2 mm, although less and greater thicknesses can also be employed.

The buried insulator layer may include a dielectric material such as silicon dioxide, silicon nitride, silicon oxynitride, boron nitride or a combination thereof. In one embodiment, the buried insulator layer may be formed by a deposition process, such as chemical vapor deposition (CVD), plasma enhanced chemical vapor deposition CVD (PECVD) or physical vapor deposition (PVD). In another embodiment, the buried insulator layer may be formed using a thermal growth process, such as thermal oxidation, to convert a surface portion of the handle substrate. In yet another embodiment, the buried insulator layer can also be formed by implanting oxygen atoms into a bulk semiconductor substrate and thereafter annealing the structure. The thickness of the buried insulator layer can be from 50 nm to 200 nm, although lesser or greater thicknesses can also be employed.

The top semiconductor layer may include any semiconductor material as mentioned above for the handle substrate. Exemplary semiconductor materials that can be employed as the top semiconductor layer include, but are not limited to, Si, Ge, SiGe, SiC and SiGeC, and III/V compound semiconductors such as, for example, InAs, GaAs, and InP. The semiconductor materials of the top semiconductor layer and the handle substrate may be the same or different. Typically, each of the handle substrate and the top semiconductor layer comprises a single crystalline semiconductor material, such as, for example, single crystalline silicon. The top semiconductor layer can be formed by a deposition process, such as CVD or PECVD. The top semiconductor layer that is formed may have a thickness from 10 nm to 200 nm, although lesser or greater thicknesses can also be employed. Alternatively, the top semiconductor layer may be formed using a smart cut process where two semiconductor wafers are bonded together with an insulator in between.

In some embodiments of the present application, a hard mask layer (not shown) can be formed on the top semiconductor layer prior to forming the semiconductor fin 10. When employed, the hard mask layer may comprise an oxide, nitride, oxynitride or any combination thereof including multilayers. In one embodiment, the hard mask layer includes silicon dioxide or silicon nitride. The hard mask layer can be formed utilizing a conventional deposition process such as, for example, CVD or PECVD. Alternatively, the hard mask layer can be formed by a thermal process such as, for example, oxidation or nitridation of the top semiconductor layer. Any combination of the above mentioned processes can also be used in forming the hard mask layer. The hard mask layer that is formed can have a thickness from 20 nm to 80 nm, although lesser or greater thicknesses can also be employed.

In one embodiment, the semiconductor fin 10 can be formed by lithography and etching. The lithographic step includes applying a photoresist layer (not shown) atop the top semiconductor layer (or the hard mask, if present), exposing the photoresist layer to a desired pattern of radiation, and developing the exposed photoresist layer utilizing a conventional resist developer. The etching process comprises dry etching such as, for example, reactive ion etch (RIE) and/or wet chemical etching. The etching process transfers the pattern from the patterned photoresist layer to the top semiconductor layer or first to the hard mask layer, if present, and thereafter to the underlying top semiconductor layer utilizing the buried insulator layer as an etch stop. After transferring the pattern into the top semiconductor layer, the patterned photoresist layer can be removed utilizing a conventional resist stripping process such as, for example, ashing. Alternatively, the semiconductor fin 10 can also be formed utilizing a sidewall image transfer (SIT) process. In a typical SIT process, spacers are formed on a sacrificial mandrel. The sacrificial mandrel is removed and the remaining spacers are used as a hard mask to etch the top semiconductor layer. The spacers are then removed after the semiconductor fins have been formed.

The semiconductor fin 10 can have a rectangular horizontal cross-sectional area. The width of the semiconductor fin 10 can be from 5 nm to 100 nm, although lesser and greater widths can also be employed. The height of the semiconductor fin 10 can be from 10 nm to 200 nm, although lesser and greater heights can also be employed.

In some embodiments of the present application and when the hard mask layer is present, the hard mask layer that remains atop the semiconductor fin 10 can be removed at this stage. The removal of the remaining non-etched portion of hard mask layer can be achieved by performing a selective etching process or by utilizing a planarization process such as chemical mechanical planarization (CMP).

Each gate structure includes a gate stack and a gate spacer 28 formed on sidewalls of the gate stack. The gate stack may include, from bottom to top, a gate dielectric 22, a gate electrode 24 and a gate cap 26. The gate stacks can be formed by first providing a material stack (not shown) that includes, from bottom to top, a gate dielectric layer, a gate electrode layer and a gate cap layer over the semiconductor fin 10 and the substrate 8.

The gate dielectric layer may include an oxide, nitride or oxynitride. In one example, the gate dielectric layer may include a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed. The gate dielectric layer can be formed by any deposition technique including, for example, CVD, PECVD, PVD or atomic layer deposition (ALD). Alternatively, the gate dielectric layer can also be formed by a thermal growth process such as, for example, oxidation, nitridation or oxynitridation to convert surface portions of the semiconductor fin 10 into a dielectric material. The gate dielectric layer that is formed can have a thickness ranging from 0.5 nm to 10 nm, with a thickness from 0.5 nm to about 3 nm being more typical.

The gate electrode layer may include any conductive material including, for example, doped polysilicon, an elemental metal such as W, titanium (Ti), tantalum (Ta), aluminum (Al), nickel (Ni), ruthenium (Ru), palladium (Pd) and platinum (Pt), an alloy of at least two elemental metals, a metal nitride such as tungsten nitride (WN) and titanium nitride (TiN), a metal silicide such as tungsten silicide (WSi), nickel silicide (NiSi), and titanium silicide (TiSi) or multilayered combinations thereof. The gate electrode layer can be formed utilizing a deposition process including, for example, CVD, PECVD, PVD or ALD. In embodiments in which polysilicon or SiGe are used as the gate electrode material, an in-situ deposition process can be used or alternatively deposition followed by ion implantation can be used. The gate electrode layer that is formed can have a thickness ranging from 50 nm to 200 nm, although lesser or greater thicknesses can also be employed.

The gate cap layer may include a dielectric oxide, nitride or oxynitride. In one embodiment of the present application, the gate cap layer includes silicon nitride. The gate cap layer can be formed by a deposition process including, for example, CVD, PECVD, PVD or ALD. The gate cap layer that is formed can have a thickness ranging from 25 nm to 100 nm, although lesser or greater thicknesses can also be employed.

The material stack is then patterned and etched to form the gate stacks (22, 24, 26). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as a RIE process. The remaining portions of the gate dielectric layer constitute the gate dielectrics 22. The remaining portions of the gate electrode layer constitute the gate electrodes 24. The remaining portions of the gate cap layer constitute the gate caps 26. The remaining portions of the photoresist layer may be subsequently removed by, for example, ashing.

In one embodiment, the gate stacks (22, 24, 26) can be sacrificial gate stacks that are subsequently removed, and replaced with functional gate stacks each including a functional gate dielectric, a functional gate electrode and a functional gate cap after forming source and drain regions of the semiconductor structure.

Each gate spacer 28 may include a dielectric material such as, for example, an oxide, a nitride, an oxynitride, or any combination thereof. In one embodiment, each gate spacer 28 is composed of silicon nitride. The gate spacers 28 can be formed by first providing a conformal gate spacer material layer (not shown) on exposed surfaces of the gate stacks (22, 24, 26), the semiconductor fin 10 and the substrate 8 and then etching the gate spacer material layer to remove horizontal portions of the gate spacer material layer. The gate spacer material layer can be provided by a deposition process including, for example, CVD, PECVD or ALD. The etching of the gate spacer material layer may be performed by a dry etch process such as, for example, RIE. The remaining portions of the gate spacer material layer constitute the gate spacer(s) 28. The width of each gate spacer 28, as measured at the base of the gate spacer 28 can be from 5 nm to 100 nm, although lesser and greater widths can also be employed.

Figure 2:
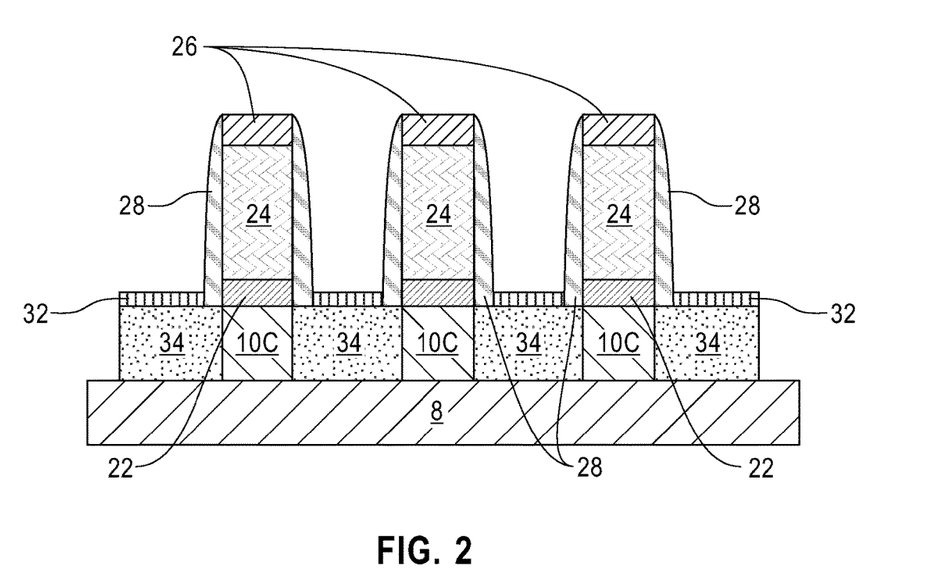
FIG. 2 is a cross-sectional view of the first exemplary semiconductor structure of FIG. 1 after forming epitaxial source/drain regions and fin source/drain regions on opposite sides of the gate structures.

Referring to FIG. 2, an epitaxial source region and an epitaxial drain region (collectively referred to as epitaxial source/drain regions 32) are formed over portions of the semiconductor fin 10 located on opposite sides of each gate structure (22, 24, 26, 28). As used herein, a "source/drain" region can be a source region or a drain region depending on subsequent wiring and application of voltages during operation of a FinFET. The epitaxial source/drain regions 32 can be formed by epitaxially depositing a semiconductor material over exposed semiconductor surfaces, i.e., top and sidewall surfaces of the semiconductor fin 10, but not on dielectric surfaces such as the surfaces of the gate caps 26, the gate spacers 28 and the substrate 8. In one embodiment, the selective epitaxy growth process can proceed until the epitaxial source/drain regions 32 merge neighboring semiconductor fins (not shown).

The semiconductor material that provides the epitaxial source/drain regions 32 can include Si, Ge, SiGe or SiC. In one embodiment, the epitaxial source/drain regions 32 are composed of SiGe for formation of p-type FinFETs. In another embodiment, the epitaxial source/drain regions 32 are composed of Si for formation of n-type FinFETs.

In one embodiment, the epitaxial source/drain regions 32 can be formed with in-situ doping during the selective epitaxy process. Thus, the epitaxial source/drain regions 32 can be formed as doped semiconductor material portions. Alternatively, the epitaxial source/drain regions 32 can be formed by ex-situ doping. In this case, the epitaxial source/drain regions 32 can be formed as intrinsic semiconductor portions and n-type or p-type dopants can be subsequently introduced into the epitaxial source/drain regions 32 to convert the intrinsic semiconductor material portions into doped semiconductor material portions. Exemplary n-type dopants include, but are not limited to, phosphorous, arsenic and antimony. Exemplary p-type dopants include, but are not limited to, aluminum, boron, gallium and indium.

If ex-situ doping is employed, ion implantation or gas phase doping can also introduce dopants into portions of the semiconductor fin 10 that do not underlie the gate stacks (22, 24, 26). The resulting doped portions within the semiconductor fin 10 are herein referred to fin source/drain regions 34. If in-situ doping is employed, an anneal process can be performed to outdiffuse dopants from the epitaxial source/drain regions 32 into underlying portions of the semiconductor fin 10 to form the fin source/drain regions 34. The epitaxial source/drain regions 32 and the fin source/drain regions 34 together constitute source/drain regions for FinFETs. A remaining portion of the semiconductor fin 10 that is located beneath a corresponding gate stack (22, 24, 26) constitutes a channel region 10C of a FinFET.

Figure 3:
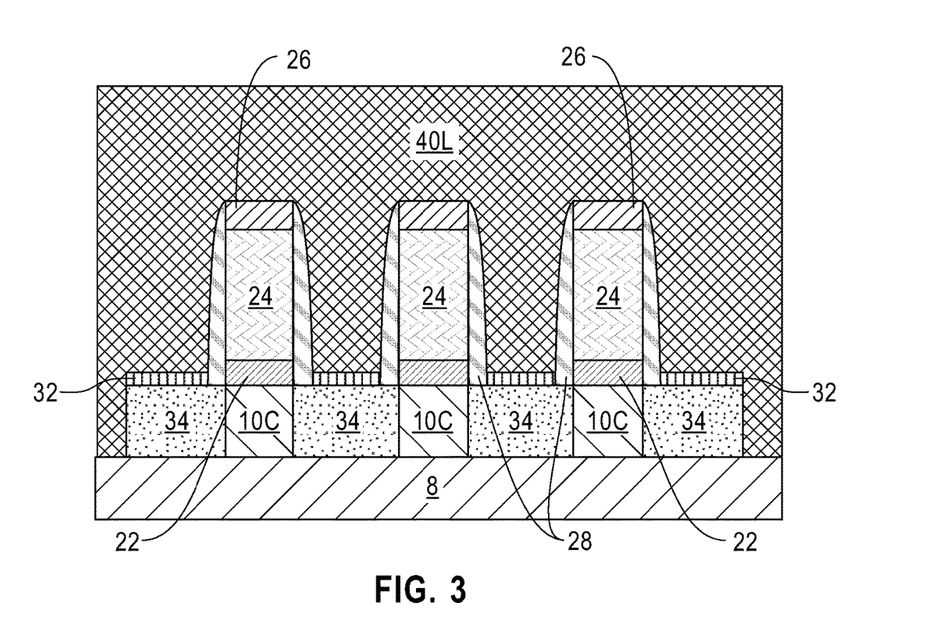
FIG. 3 is a cross-sectional view of the first exemplary semiconductor structure of FIG. 2 after forming an interlevel dielectric (ILD) layer over the gate structures, the epitaxial source/drain regions and the substrate.

Referring to FIG. 3, an interlevel dielectric (ILD) layer 40L is formed over the gate structures (22, 24, 26, 28), the epitaxial source/drain regions 32 and the substrate 8. In some embodiments of the present application, the ILD layer 40L is composed of a dielectric material that may be easily planarized. For example, the ILD layer 40L can include a doped silicate glass, an undoped silicate glass (silicon oxide), an organosilicate glass (OSG), a porous dielectric material, or amorphous carbon. The ILD layer 40L can be deposited using a conventional deposition process such as, for example, CVD, PECVD or spin coating. If the ILD layer 40L is not self-planarizing, following the deposition of the ILD layer 40L, the ILD layer 40L can be subsequently planarized, for example, by chemical mechanical planarization (CMP). The planarized top surface of the ILD layer 40L is located above the topmost surfaces of the gate stacks (22, 24, 26) (i.e., the top surfaces of the gate caps 26)

Figure 4:
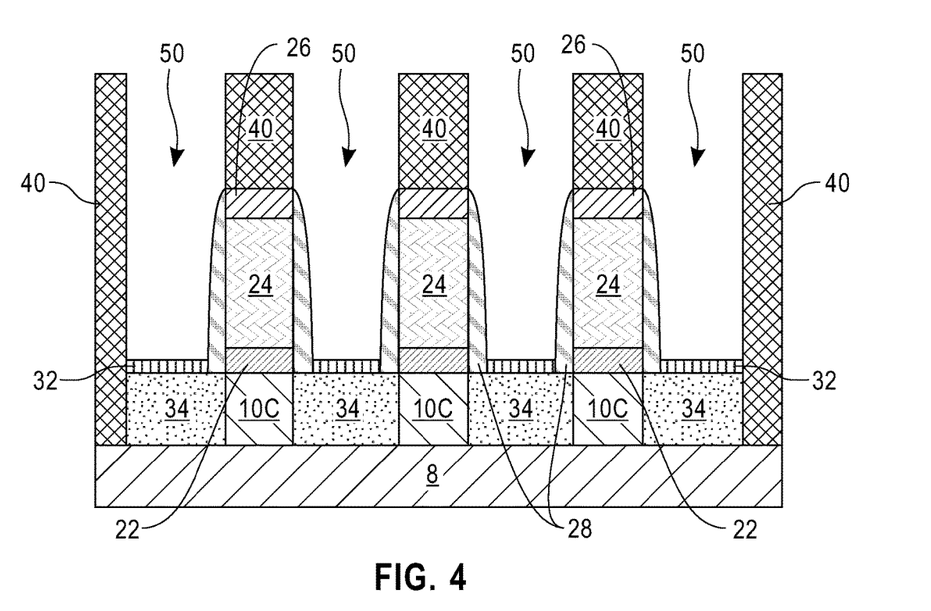
FIG. 4 is a cross-sectional view of the first exemplary semiconductor structure of FIG. 3 after forming source/drain contact trenches through the ILD layer to expose at least a portion of each epitaxial source/drain regions.

Referring to FIG. 4, source/drain contact trenches 50 are formed extending through the ILD layer 40L. Each source/drain contact trench 50 exposes at least a portion of one of the epitaxial source/drain regions 32. In one embodiment and as shown in FIG. 4, each source/drain contact trench 50 exposes an entirety of one of the epitaxial source/drain regions 32. The source/drain contact trenches 50 can be formed by applying a mask layer (not shown) over the ILD layer 40L, and then lithographically patterning the mask layer to form openings therein. Each opening overlies at least a portion of one of the epitaxial source/drain regions 32. The mask layer can be a photoresist layer or a photoresist layer in conjunction with hardmask layer(s). The pattern in the mask layer is transferred through the ILD layer 40L to form the source/drain contact trenches 50. In one embodiment of the present application, a RIE may be performed to remove exposed portions of the ILD layer 40L to expose epitaxial source/drain regions 32 within the source/drain contact trenches 50. Remaining portions of the ILD layer 40L are herein referred to as ILD portions 40. After forming the source/drain contact trenches 50, the remaining mask layer can be removed by oxygen-based plasma etching.

Figure 5:
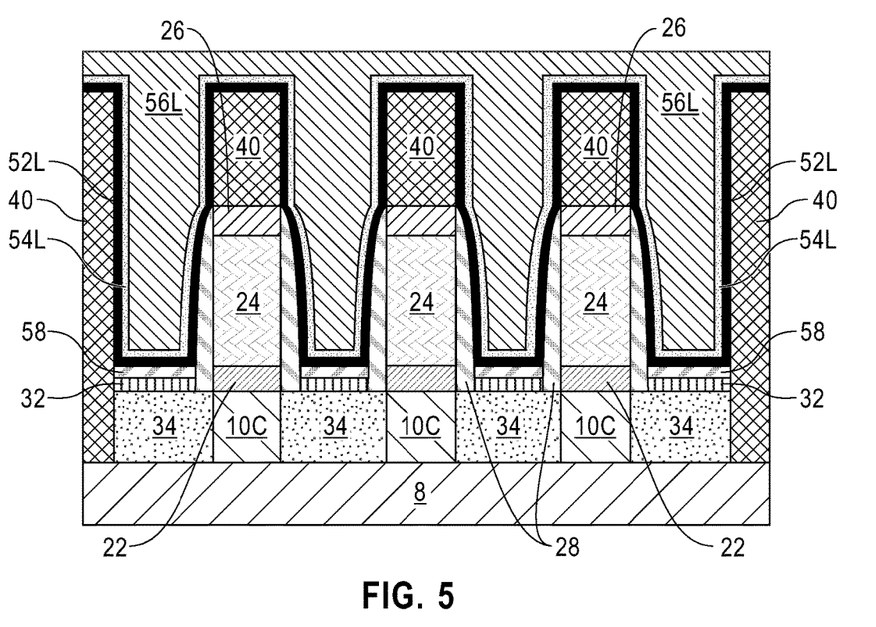
FIG. 5 is a cross-sectional view of the first exemplary semiconductor structure of FIG. 4 after forming an elemental metal liner layer on sidewalls and bottom surfaces of the source/drain contact trenches, a metal nitride liner layer over the elemental metal liner layer and a first contact metal layer over the metal nitride liner layer.

Referring to FIG. 5, an elemental metal liner layer 52L is deposited on sidewalls and bottom surfaces of the source/drain contact trenches 50 and top surfaces of the ILD portions 40. The element metal liner layer 52L may include Ti, Ni, Pt or an alloy of thereof. In one embodiment, the element metal liner layer 52L is composed of Ti. The element metal liner layer 52L may be formed utilizing a conventional deposition process including PVD, CVD or ALD. The element metal liner layer 52L that is formed may have a thickness from 5 nm to 40 nm, although lesser and greater thicknesses can also be employed.

Next, a metal nitride liner layer 54L is conformally deposited over the elemental metal liner layer 52L. The metal nitride liner layer 54L may include TiN. The metal nitride liner layer 54L may be formed, for example, by CVD or ALD. The thickness of the metal nitride liner layer 54L may be from 3 nm to 60 nm, although lesser and greater thicknesses can also be employed.

A first contact metal layer 56L is subsequently deposited over the metal nitride liner layer 54L and in the remaining volume of each of the source/drain contact trenches 50 until the source/drain contact trenches 50 are completely filled. The first contact metal layer 56L includes a metal having a higher electromigration resistance than a metal providing a second contact metal layer subsequently formed. The metal providing the first contact metal layer 56L typically has an electromigration resistance higher than Cu. In one embodiment, the first contact metal layer 56L includes W. The first contact metal layer can be formed by any suitable deposition method such as, for example, CVD, PVD or plating.

Figure 6:
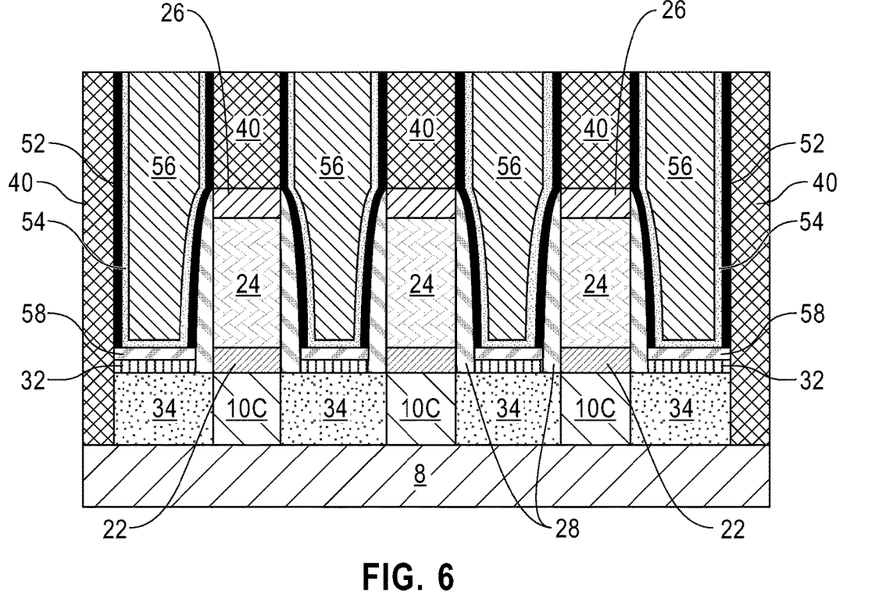
FIG. 6 is a cross-sectional view of the first exemplary semiconductor structure of FIG. 5 after forming elemental metal liners, the metal nitride liners and first contact conductors in the source/drain contact trenches.

Referring to FIG. 6, portions of the first contact metal layer 56L, the metal nitride liner layer 54L and the elemental metal liner layer 52L that are located above the top surfaces of the ILD portions 40 are removed by a planarization process such as, for example, CMP. Remaining portions of the elemental metal liner layer 52L are herein referred to as elemental metal liners 52. Remaining portions of the metal nitride liner layer 52L are herein referred to as metal nitride liners 54. Remaining portions of the first contact metal layer 56L are herein referred to as first contact conductors 54. The top surfaces of the elemental metal liners 52, the metal nitride liners 54 and the first contact conductors 56 are coplanar with the top surfaces of the ILD layer portions 40.

After formation of the elemental metal liners 52, the metal nitride liners 54 and the first contact conductors 56, the structure is annealed, for example, by a thermal annealing process or a laser annealing process to induce the reaction of the metal that provides the elemental metal liners 52 and the semiconductor material that provides the epitaxial source/drain regions 32. In one embodiment and as shown in FIG. 6, entire bottom portions of the elemental metal liners 52 that are in contact with the epitaxial source/drain regions 32 react with the underlying Si or Ge in the epitaxial source/drain regions 32 to form metal semiconductor alloy regions 58. The metal semiconductor alloy regions 58 reduce contact resistance between the first contact conductors 54 and the epitaxial source/drain regions 32. The metal semiconductor alloy that is formed may include a metal silicide or a metal germicide. In one embodiment and when the elemental metal liners 52 are composed of Ti, the metal semiconductor alloy regions 58 include TiSi.

Figure 7:
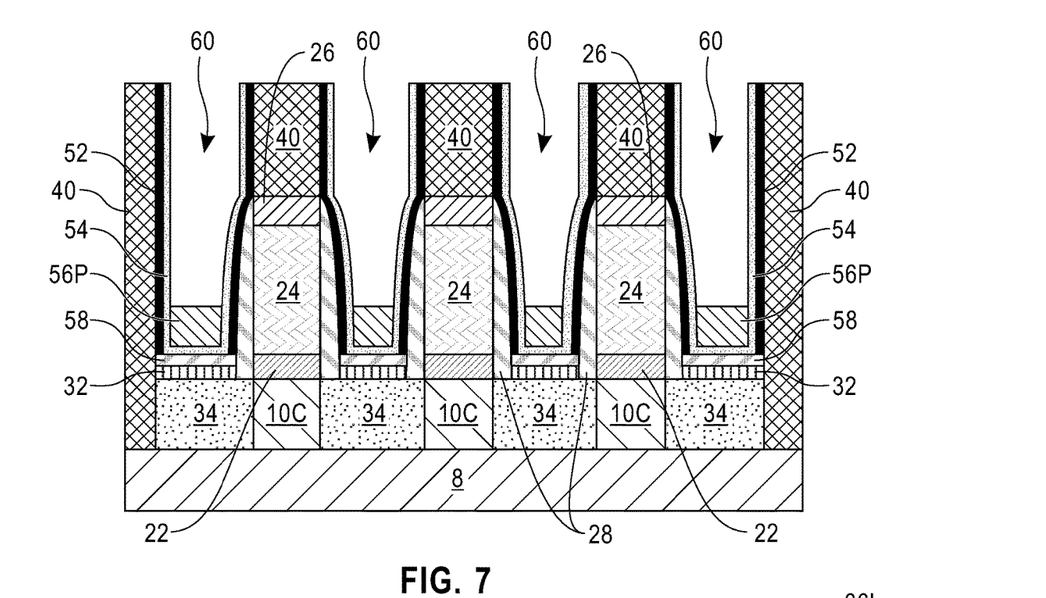
FIG. 7 is a cross-sectional view of the first exemplary semiconductor structure of FIG. 6 after recessing the first contact conductors to provide a first contact conductor portion at a bottom portion of each source/drain contact trench and an opening above the first contact conductor portion within each source/drain contact trench.

Referring to FIG. 7, the first contact conductors 56 are recessed utilizing an anisotropic etch that removes the metal of the first contact conductors 56 selective to the metal nitride of the metal nitride liners 54. In instances where the first contact conductors 56 are composed of W and the metal nitride liners 54 are composed of TiN, the first contact conductors 56 can be etched utilizing $NF_3$-containing plasma. The first contact conductors 56 are etched to a depth such that the top surfaces of the remaining portions of the first contact conductors 56 (herein referred to as first contact conductor portions 56P) are located below the topmost surfaces of the gate stacks (22, 24, 26). In one embodiment, the first contact conductor portions 56P have a height ranging from 10 nm to 15 nm. After etch back of the first contact conductors 56, an opening 60 is formed above each first contact conductor portion 56P in the source/drain contact trenches 50.

Figure 8:
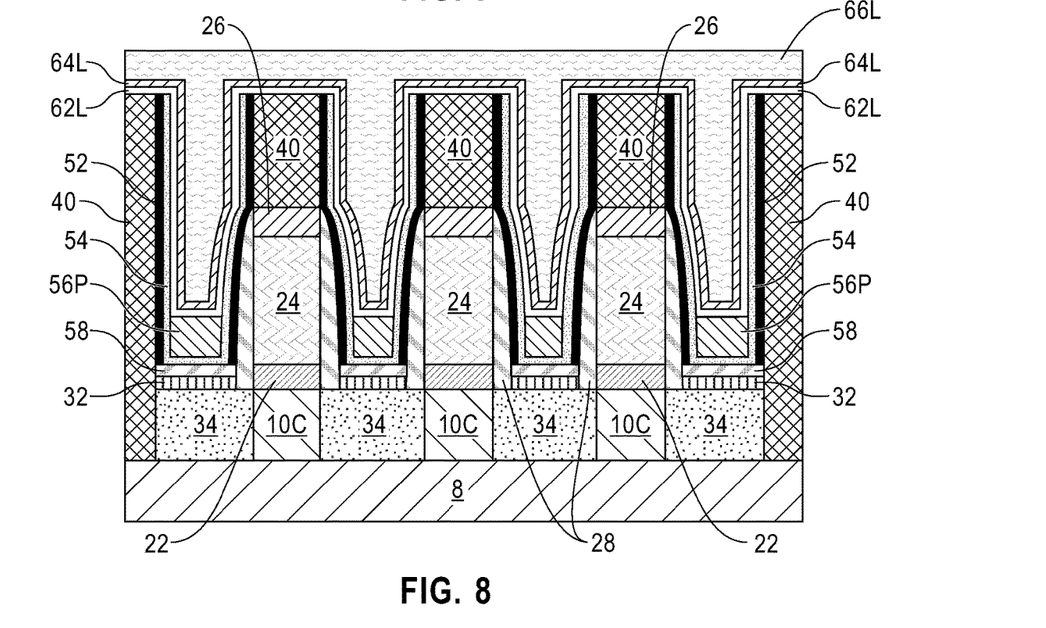
FIG. 8 is a cross-sectional view of the first exemplary semiconductor structure of FIG. 7 after forming a contact liner material layer along sidewalls and bottom surfaces of the openings, an adhesion layer over the contact liner material layer and a second contact metal layer over the adhesion layer.

Referring to FIG. 8, a contact liner material layer 62L is conformally deposited onto the exposed surfaces of the metal nitride liners 54 as well as the top surfaces of the elemental metal liners 52, the first contact conductor portions 56P and ILD portions 40. The contact liner material layer 62L may include TaN, Ta/TaN or TaN/Ta. The contact liner material layer 62L can be formed, for example, by CVD or ALD. The contact liner material layer 62L that is formed may have a thickness from 5 nm to 40 nm, although lesser and greater thicknesses can also be employed.

An adhesion layer 64L is conformally deposited over the contact liner material layer 62L. The adhesion layer 64L is provided to promote the complete filling of the openings 60 with a second contact metal layer subsequently formed. The adhesion layer 64L may include a noble metal such as, for example, Ru, Ir, Os, Rh, Pd, Pt, Au, or alloys thereof. In one embodiment, the adhesion layer 64L is composed of Ru. The adhesion layer 64L may be formed, for example, by CVD or ALD. A thickness of the adhesion layer 64L may range from 1 nm to 20 n, although lesser and greater thicknesses can also be employed.

A second contact metal layer 66L is depositing over the adhesion layer 64L by a reflow process until the openings 60 are completely filled. The reflow process can be performed at a relatively low temperature ranging from 100° C. to 400° C. under an inert ambient. During the reflow process, the capillary force drew the deposited metal that provides the second contact metal layer 66L into the openings 60 to enable a rapid, void-free fill. The second contact metal layer 66L thus formed is substantially void-free. The second contact metal layer 66L includes a highly conductive metal having an electrical resistance lower than that of the metal providing the first contact conductor portion 56P. In one embodiment, highly conductive metals, such as, for example, Cu or Cu alloys can be employed in the second contact metal layer 66L.

Figure 9:
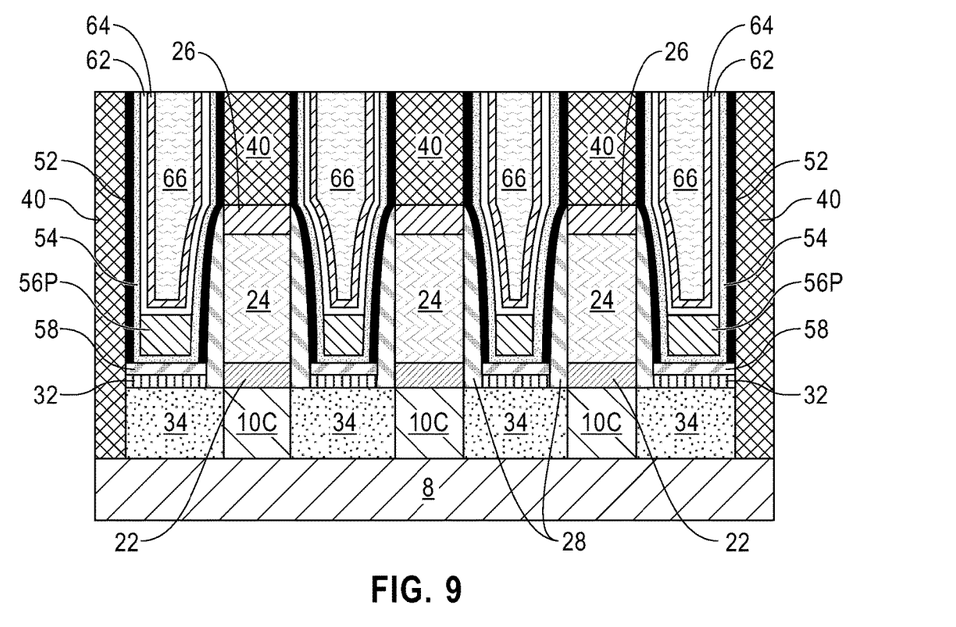
FIG. 9 is a cross-sectional view of the first exemplary semiconductor structure of FIG. 8 after forming a contact liner, an adhesion layer portion and a second contact conductor portion within each opening.

Referring to FIG. 9, portion of the second contact metal layer 66L, the adhesion layer 64L and the contact liner material layer 62L that are located above the top surfaces of the ILD portions 40 are removed, for example, by CMP. Remaining portions of the contact liner material layer 62L are herein referred to as contact liners 62. Remaining portions of the adhesion layer 64L are herein referred to as adhesion layer portions 64. Remaining portions of the second contact metal layer 66L are herein referred to as second contact conductor portions 66. The top surfaces of the contact liners 62, the adhesion layer portions 64 and the second contact conductor portions 66 are coplanar with the top surfaces of the ILD portions 40.

Thus, a dual metal source/drain contact structure is formed within each source/drain contact trench 50 to provide electrical contact to an epitaxial source/drain region 32 via, in some embodiments, a metal semiconductor alloy region 58. Each dual metal source/drain contact includes an elemental metal liner 52 located on sidewalls of a source/drain contact trench 50, a metal nitride liner 54 located over the elemental metal liner 52 and the metal semiconductor alloy region 58, a first contact conductor portion 56P located at a bottom portion of the source/drain contact trench 50 and surrounded by the metal nitride liner 54, a contact liner 62 located over a top surface of the first contact conductor portion 56P and a portion of the metal nitride liner 54 that is not covered by the first contact conductor portion 56P, an adhesion layer portion 64 located over the contact liner 62 and a second contact conductor portion 66 located over the adhesion layer portion 64. The second contact conductor portion 66 completely fills a remaining volume of the source/drain contact trench 50. In the present application, by separating the Cu-containing second contact conductor portion 66 from the source/drain region (32, 34) with a first contact conductor portion 56P comprised of a metal having a higher electromigration resistance than Cu, the risk of electromigration caused by Cu diffusion is prevented. Also, such dual metal source/drain contact structure can reduce contact resistance since an essential portion of the dual metal source/drain contact structure is composed of highly conductive Cu.

Figure 10:
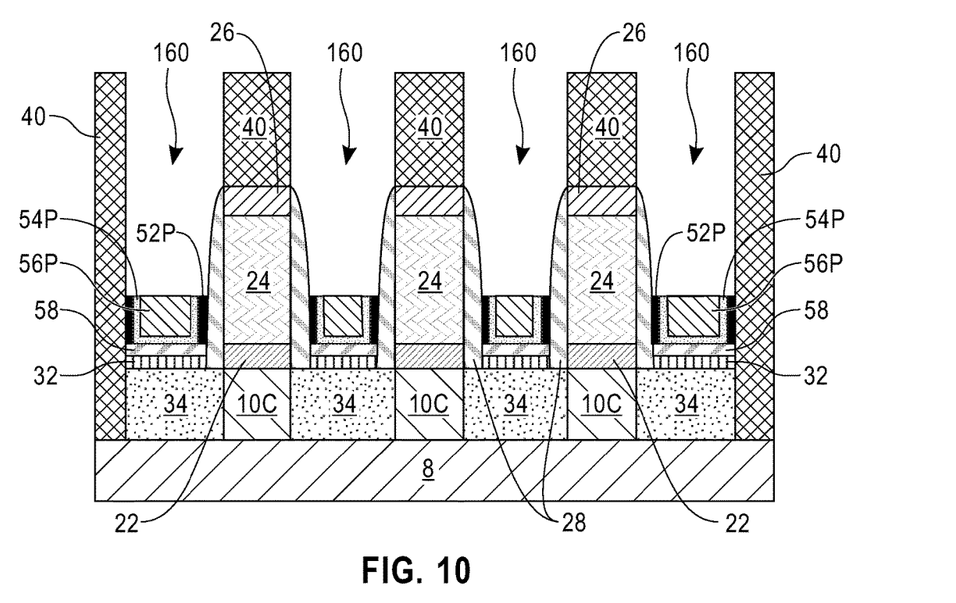
FIG. 10 is a cross-sectional view of a second exemplary semiconductor structure that can be derived from the first exemplary semiconductor structure of FIG. 7 after recessing the elemental metal liners and the metal nitride liners to provide an elemental metal liner portion and a metal nitride liner portion within each source/drain contact trench.

Referring to FIG. 10, a second exemplary semiconductor structure according to a second embodiment of the present application can be derived from FIG. 7 after removing portions of the elemental metal liners 52 and metal nitride liners 54 that are not covered by the first contact conductor portions 56P. An anisotropic etch which can be a dry etch or a wet etch is performed to remove metals providing the elemental metal liners 52 and the metal nitride liners 54 selective to the metal providing the first contact conductor portions 56P. In one embodiment, the exposed portions of the elemental metal liners 52 and the metal nitride liners 54 can be removed by a wet etch using an alkaline solution (SC-1) including an aqueous mixture of ammonium hydroxide and hydrogen peroxide (e.g., 1:1:5 of 30% $H_2O_2$, 28% $NH_4OH$ and $H_2O$). Remaining portions of the elemental metal liners 52 are herein referred to as elemental metal liner portions 52P. Remaining portions of the metal nitride liners 54 are herein referred to as metal nitride liner portions 54P. In one embodiment, after recessing, the top surfaces of the elemental metal liner portions 52P and the metal nitride liner portions 54P are coplanar with the top surfaces of the first contact conductor portions 56P. An opening 160 is thus present above the elemental metal liner portion 52P, the metal nitride liner portion 54P and the first contact conductor portion 56P within each source/drain contact trench 50.

Figure 11:
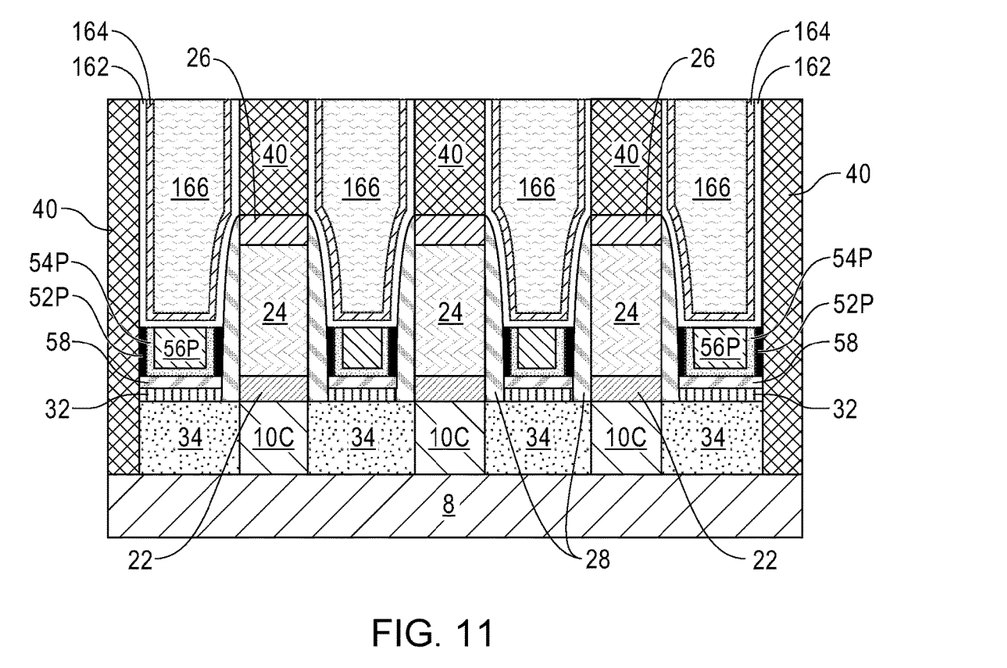
FIG. 11 is a cross-sectional view of a second exemplary semiconductor structure of FIG. 10 after forming a contact liner, an adhesion layer portion and a second contact conductor over top surfaces of the elemental metal liner portion, the metal nitride liner portion and the first contact conductor portion within each source/drain contact trench.

Referring to FIG. 11, a contact liner material layer (not shown) is formed on the top surfaces of the elemental metal liner portions 52P, the metal nitride liner portions 54P and the first contact conductor portions 56P as well as on the exposed surfaces of the ILD portions 40 and gate spacers 28 followed by sequentially forming an adhesion layer (not shown) and a second contact metal layer (not shown) over the contact liner material layer by performing processing steps of FIG. 9. Subsequently, portions of the second contact metal layer, the adhesion layer and the contact liner material layer that are located above the top surfaces of the ILD portions 40 are removed by performing the processing steps of FIG. 10. A contact liner 162 which is a remaining portion of the contact liner layer, an adhesion layer portion 164 which is a remaining portion of the adhesion layer and a second contact conductor portion 166 which is a remaining portion of the second contact metal layer are thus formed within each opening 160.

In the second embodiment, each dual metal source/drain contact includes an elemental metal liner portion 52P located on sidewalls of a bottom portion of a source/drain contact trench 50, a metal nitride liner portion 54P located over the elemental metal liner portion 52P and the metal semiconductor alloy region 58, a first contact conductor portion 56P located at the bottom portion of the source/drain contact trench 50 and surrounded by the metal nitride liner portion 54P, a contact liner 162 located over top surfaces of the elemental metal liner portion 52P, the metal nitride liner portion 54P and first contact conductor portion 54P and sidewalls of a remaining portion of the source/drain contact trench 50 that is not covered by the elemental metal liner portion 52P, an adhesion layer portion 164 located over the contact liner 162 and a second contact conductor portion 166 located over the adhesion layer portion 164. Comparing to the first exemplary dual metal source/drain contact structures (52, 54P, 56P, 62, 64, 66) illustrated in FIG. 9, removing the elemental metal liners 52 and the metal nitride liners 54 from upper portions of the source/drain contact trenches 50 further reduces the contact resistance of the second exemplary source/drain contact structures (52P, 54P, 56P, 162, 164, 166) illustrated in FIG. 11. As a result, a higher device performance can be obtained.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   forming source/drain regions on opposite sides of at least one gate structure located over a channel region of a semiconductor fin;
   forming a single interlevel dielectric (ILD) layer overlying the source/drain regions and the at least one gate structure;
   forming source/drain contact trenches through the ILD layer, each of the source/drain contact trenches exposing at least a portion of one of the source/drain regions; and
   forming a source/drain contact structure within each of the source/drain contact trenches, wherein each of the source/drain contact structures comprises a first contact conductor portion located at a bottom portion of each of the source/drain contact trenches and contacting one of the source/drain regions, and a second contact conductor portion overlying the first contact conductor portion, wherein the first contact conductor comprises a first metal and the second contact conductor portion comprises a second metal having a lower electromigration resistance and a lower electrical resistance than the first metal, and wherein each of the source/drain contact structures further comprises an elemental metal liner located on sidewalls of each of the source/drain contact trenches, a metal nitride liner located on the elemental metal liner and a bottom surface of each of the source/drain contact trenches, wherein the metal nitride liner contacts sidewalls and a bottommost surface of the first contact conductor portion, a contact liner located over the metal nitride liner and directly contacting a top surface of the first contact conductor portion, and an adhesion layer portion located on the contact liner and contacting sidewalls and a bottommost surface of the second contact conductor portion, wherein the elemental metal liner has a bottommost surface that is coplanar with a bottommost surface of the metal nitride liner.

2. The method of claim 1, wherein the first contact conductor portion comprises tungsten, and the second contact conductor portion comprises copper or a copper alloy.

3. The method of claim 1, wherein the forming the source/drain contact structures comprises:
   forming the elemental metal liner and the metal nitride liner in each of the source/drain contact trenches;
   forming a first contact conductor over the metal nitride liner and within each of the source/drain contact trenches, wherein the first contact conductor completely fills each of the source/drain contact trenches;
   recessing the first contact conductor to provide the first contact conductor portion; and forming the contact liner, the adhesion layer portion and the second contact conductor portion on top of the first contact conductor portion.

4. The method of claim 1, wherein the elemental metal liner comprises Ti, Ni, Pt or an alloy thereof, and the metal nitride liner comprises TiN.

5. The method of claim 1, wherein the forming the elemental metal liner, the metal nitride liner, and the first contact conductor comprises:
   forming a conformal elemental metal liner layer over the bottom surface and the sidewalls of each of the source/drain contact trenches and a top surface the ILD layer;
   forming a conformal metal nitride liner layer over the elemental metal liner layer;
   forming a first contact metal layer over the metal nitride liner layer to completely fill each of the source/drain contact trenches; and
   removing portions of the first contact metal layer, the metal nitride liner layer and the elemental metal liner layer from the top surface of the ILD layer.

6. The method of claim 1, further comprising annealing the semiconductor structure such that a bottom portion of the elemental metal liner reacts with the exposed portion of the one of the source/drain regions to form a metal semiconductor alloy region over each of the source/drain regions.

7. The method of claim 3, wherein the forming the contact liner, the adhesion layer portion and the second contact conductor portion comprises:
   forming a conformal contact liner material layer over the first contact conductor portion, the portion of the metal liner that is not covered by the first contact conductor portion, and the top surface of the ILD layer;
   forming a conformal adhesion layer over the contact liner material layer;
   forming a second contact metal layer over the adhesion layer to completely fill each of the source/drain contact trenches; and
   removing portions of the contact liner material layer, the adhesion layer and the second contact metal layer from the top surface of the ILD layer to provide the contact liner, the adhesion layer portion and the second contact conductor portion, respectively.

8. The method of claim 3, wherein the contact liner comprises TaN, Ta/TaN or TaN/Ta, and the adhesion layer portion comprises Ru.

9. The method of claim 3, wherein the recessing the first contact conductor is performed by an anisotropic etch.

10. The method of claim 9, wherein the anisotropic etch is performed using $NF_3$-containing plasma.

11. The method of claim 1, wherein the first contact conductor portion has a height ranging from 10 nm to 15 nm.

12. The method of claim 1, wherein the second contract conductor portion has a top surface coplanar with topmost surfaces of the metal liner.

13. A method of forming a semiconductor structure comprising:
   forming source/drain regions on opposite sides of at least one gate structure located over a channel region of a semiconductor fin;
   forming a single interlevel dielectric (ILD) layer overlying the source/drain regions and the at least one gate structure;
   forming source/drain contact trenches through the ILD layer, each of the source/drain contact trenches exposing at least a portion of one of the source/drain regions; and
   forming a source/drain contact structure within each of the source/drain contact trenches, wherein each of the source/drain contact structures comprises a first contact conductor portion located at a bottom portion of each of the source/drain contact trenches and contacting one of the source/drain regions, and a second contact conductor portion overlying the first contact conductor portion, wherein the first contact conductor comprises a first metal and the second contact conductor portion comprises a second metal having a lower electromigration resistance and a lower electrical resistance than the first metal, and wherein each of the source/drain contact structures further comprises an elemental metal liner portion present along sidewalls of the bottom portion of each of the source/drain contact trenches, a metal nitride liner portion located on the elemental metal liner and directly contacting sidewalls and a bottommost surface of the first contact conductor portion, a contact liner over the first contact conductor portion, the elemental metal liner portion and the metal nitride liner portion and along sidewalls of an upper portion of each of the source/drain contact trenches not covered by the elemental metal liner portion or the metal nitride liner portion, and an adhesion layer portion overlying the contact liner and contacting sidewalls and a bottommost surface of the second contact conductor portion, and wherein the elemental metal liner has a bottommost surface that is coplanar with a bottommost surface of the metal nitride liner.

14. The method of claim 13, wherein the forming the source/drain contact structures comprises:
   forming elemental metal liner on the sidewalls and the bottom surface of each of the source/drain contact trenches and a metal nitride liner on the elemental metal liner;
   forming a first contact conductor over the metal nitride liner and within each of the source/drain contact trenches, wherein the first contact conductor completely fills each of the source/drain contact trenches;
   recessing the first contact conductor, the elemental metal liner, and the metal nitride liner to provide the first contact conductor portion, the elemental metal liner portion, and the metal liner portion, respectively; and
   forming the contact liner, the adhesion layer portion and the second contact conductor portion on top of the first contact conductor portion, the elemental metal liner portion and the metal nitride liner portion.

15. The method of claim 14, wherein the first contact conductor portion has a top surface coplanar with topmost surfaces of the elemental metal liner portion and the metal nitride liner portion.

16. The method of claim 13, wherein the elemental metal liner portion comprises Ti, Ni, Pt or an alloy thereof, and the metal nitride liner portion comprises TiN.

17. The method of claim 16, wherein the recessing the metal liner is performed by a wet etch using an alkaline solution (SC-1) including an aqueous mixture of ammonium hydroxide and hydrogen peroxide.

* * * * *